United States Patent
Pons

(10) Patent No.: US 10,450,851 B2
(45) Date of Patent: Oct. 22, 2019

(54) CALCULATING DOWNHOLE CARD IN DEVIATED WELLBORE USING PARAMETERIZED SEGMENT CALCULATIONS

(71) Applicant: Weatherford Technology Holdings, LLC, Houston, TX (US)

(72) Inventor: Victoria M. Pons, Katy, TX (US)

(73) Assignee: Weatherford Technology Holdings, LLC, Houston, TX (US)

( * ) Notice: Subject to any disclaimer, the term of this patent is extended or adjusted under 35 U.S.C. 154(b) by 361 days.

(21) Appl. No.: 15/362,501

(22) Filed: Nov. 28, 2016

(65) Prior Publication Data

US 2017/0152737 A1 Jun. 1, 2017

Related U.S. Application Data

(60) Provisional application No. 62/261,044, filed on Nov. 30, 2015.

(51) Int. Cl.
| | |
|---|---|
| *E21B 47/00* | (2012.01) |
| *E21B 43/12* | (2006.01) |
| *E21B 41/00* | (2006.01) |
| *G01V 11/00* | (2006.01) |
| *G06F 17/50* | (2006.01) |

(52) U.S. Cl.
CPC ........ E21B 47/0008 (2013.01); E21B 43/127 (2013.01); *E21B 41/0092* (2013.01); *E21B 2043/125* (2013.01); *G01V 11/002* (2013.01); *G06F 17/5086* (2013.01)

(58) Field of Classification Search
CPC ........................... E21B 47/0008; E21B 43/127
See application file for complete search history.

(56) References Cited

U.S. PATENT DOCUMENTS

| | | |
|---|---|---|
| 3,343,409 A | 9/1967 | Gibbs |
| 4,490,094 A | 12/1984 | Gibbs |
| 4,594,665 A | 6/1986 | Chandra et al. |
| 5,252,031 A | 10/1993 | Gibbs |
| 5,423,224 A | 6/1995 | Paine |
| 5,464,058 A | 11/1995 | McCoy et al. |

(Continued)

OTHER PUBLICATIONS

Everitt, T. A. and Jennings, J. W., "An Improved Finite-Difference Calculation of Downhole Dynamometer Cards for Sucker-Rod Pumps," SPE 18189, 1991.

(Continued)

*Primary Examiner* — Kristyn A Hall
(74) *Attorney, Agent, or Firm* — Blank Rome, LLP

(57) ABSTRACT

In a deviated wellbore, a pump system computes downhole data from surface data by solving a wave equation that takes both viscous damping and Coulomb friction into consideration. Mechanical friction between the rods, couplings, and tubing is considered in the calculation of downhole data in the deviated wellbore by modelling the wellbore's trajectory, parameterizing various deviated segments (build-ups, slants, drop-offs, etc.) in the trajectory, mapping the rod string to the segments, and incrementally evaluating position of the mapped string over time in order to compute drag forces and side loads experienced by the rod string during operation. These computed drag forces and side loads are then used in the solution of the wave equation to solve the surface load and position data and provide more accurate downhole position and load data.

25 Claims, 8 Drawing Sheets

(56) References Cited

U.S. PATENT DOCUMENTS

| | | | |
|---|---|---|---|
| 7,032,659 | B2 | 4/2006 | Barnes et al. |
| 7,168,924 | B2 | 1/2007 | Beck et al. |
| 7,500,390 | B2 | 3/2009 | Mills |
| 8,036,829 | B2 | 10/2011 | Gibbs et al. |
| 8,433,516 | B1 | 4/2013 | Gibbs et al. |
| 2003/0065447 | A1 | 4/2003 | Bramlett et al. |
| 2004/0062657 | A1 | 4/2004 | Beck et al. |
| 2006/0149476 | A1 | 7/2006 | Gibbs et al. |
| 2006/0251525 | A1 | 11/2006 | Beck et al. |
| 2007/0286750 | A1 | 12/2007 | Beck et al. |
| 2010/0111716 | A1 | 5/2010 | Gibbs et al. |
| 2011/0091332 | A1 | 4/2011 | Ehimeakhe |
| 2011/0091335 | A1 | 4/2011 | Ehimeakhe et al. |
| 2013/0104645 | A1 | 5/2013 | Pons |

OTHER PUBLICATIONS

Gibbs, S. G., "Design and Diagnosis of Deviated Rod-Pumped Wells", SPE 22787, 1992.

Lukasiewicz, S. A., "Dynamic Behavior of the Sucker Rod String in the Inclined Well", SPE 21665, 1991.

Lui, X. et al., "An Approach to the Design Calculation of Sucker Rod Pumping System in Coalbed Methane Wells," Chinese Journal of Mechanical Engineering, vol. 24, No. *, 2011.

Weatherford International, "ePIC Rod Pump Controller," Product Brochure, copyright 2008.

Weatherford International, "LOWIS: Life of Well Information Software," Product Brochure, copyright 2008.

Weatherford International, "Model 2000 Rod Pump Controller," Product Brochure, copyright 2008.

Weatherford International, "WellPilot Rod Pump Optimization Controller," Product Brochure, copyright 2010-2012.

Rosberg, "Well testing, methods and applicability", Engineering Geology Lund University, 2010. [Retreived on Dec. 21, 2012]. Retrieved from the internet:<URL:http://lup.lub.lu.se/luur/download?func=downloadFile&recordOld=1598933&fileOld=1598935>.

Weidner, "Horsepower to Drive a Pump", Phillips Electric 2003, pp. 1-6 [Retreived on Dec. 21, 2012]. Retrieved from the internet:,URL:http://www.phillipselectric.com/pdf/HP_Req_for_Pumps.pdf>.

Ehimeakhe, V., "Modified Everitt-Jennings (MEJ) Method and the Gibbs Method: Downhole Card Comparison", 6th Annual Sucker Rod Pumping Workshop, Sep. 14-17, 2010.

Ehimeakhe, V., "Comparative Study of Downhole Cards Using Modified Everitt-Jennings Method and Gibbs Method", Southwestern Petroleum Short Course 2010.

Ehimeakhe, V., "Calculating Pump Fillage for Well Control using Transfer Point Location", SPE Eastern Regional Meeting, Oct. 12-14, 2010.

Gibbs, S. G., and Neely, A. B., "Computer Diagnosis of Down-Hole Conditions in Sucker Rod Pumping Wells," JPT (Jan. 1996) 91-98; Trans., AIME,237.

Gibbs, S. G., "A Review of Methods for Design and Analysis of Rod Pumping Installations," SPE 9980 presented at the 1982 SPE International Petroleum Exhibition and Technical Symposium, Beijing, Mar. 18-26.

Knapp, R. M., "A Dynamic Investigation of Sucker-Rod Pumping," MS thesis, U. of Kansas, Topeka (Jan. 1969).

Schafer, D. J. and Jennings, J. W., "An Investigation of Analytical and Numerical Sucker-Rod Pumping Mathematical Models," paper SPE 16919 presented at the 1987 SPE Annual Technical Conference and Exhibition, Sep. 27-30.

Xu, J. et al, "Rod Pumping Deviated Wells," Lufkin Automation, copyright 2005, 14-pgs.

Rahman, S.S. et al., Casing Design Theory and Practice, Developments in Petroleum Science 42, "Chapter 4: Casing Design for Special Applications," Elsevier 1995, pp. 177-193.

Extended European Search Report in counterpart EP Appl. 16201509.3, dated Jul. 6, 2017, 12-pgs.

Pons, V., Optimal Stress Calculations for Sucker Rod Pumping Systems,: SPE 171346, dated Oct. 8, 2014.

First Examination Report in counterpart Canadian Appl. 2,950,093, dated Mar. 14, 2018, 4-pgs.

First Examination Report in counterpart EP Appl. 16201509.3, dated May 24, 2018, 5-pgs.

(BACKGROUND)

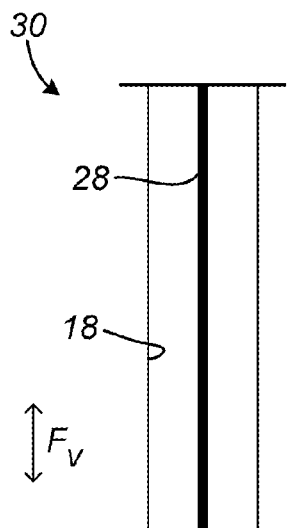
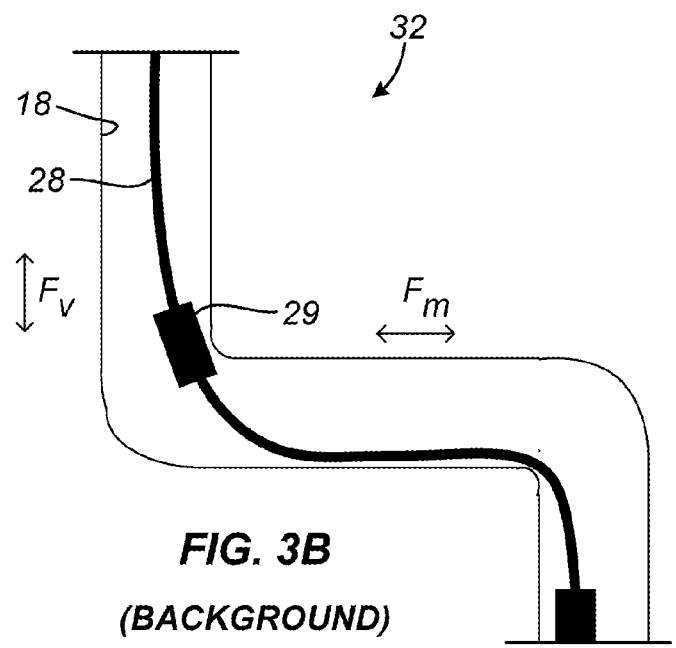
FIG. 3A
(BACKGROUND)
FIG. 3B
(BACKGROUND)
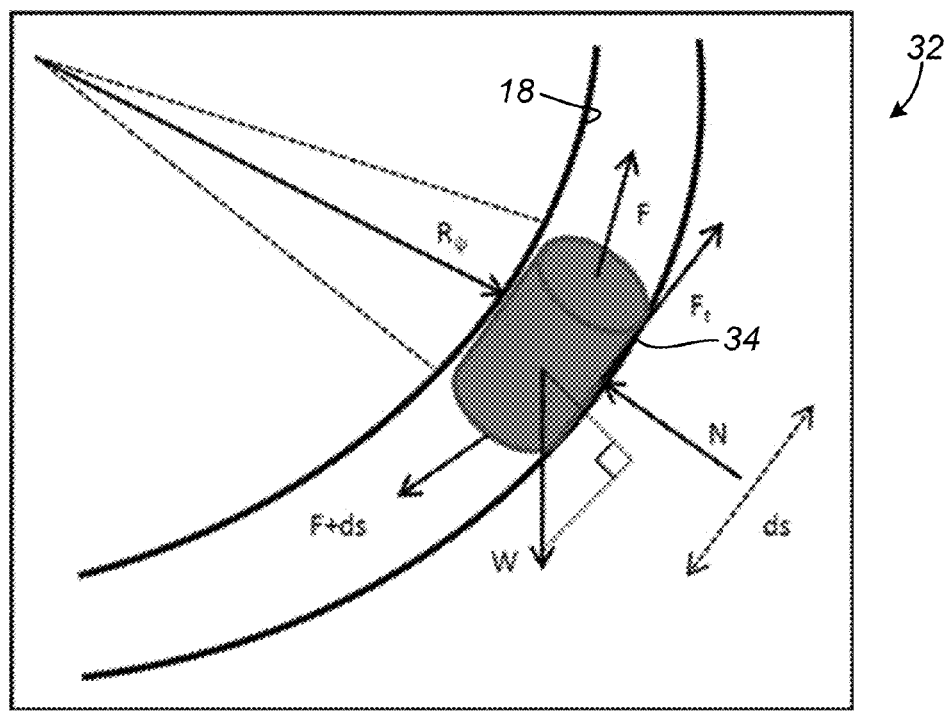
FIG. 3C
(BACKGROUND)

CALCULATING DOWNHOLE CARD IN DEVIATED WELLBORE USING PARAMETERIZED SEGMENT CALCULATIONS

CROSS-REFERENCE TO RELATED APPLICATIONS

This is a non-provisional of U.S. Patent Application Ser. No. 62/261,044, filed 30 Nov. 2015, which is incorporated herein by reference in its entirety and to which priority is claimed.

BACKGROUND OF THE DISCLOSURE

A. Sucker Rod Pump System

Reciprocating pump systems, such as sucker rod pump systems, extract fluids from a well and employ a downhole pump connected to a driving source at the surface. A rod string connects the surface driving force to the downhole pump in the well. When operated, the driving source cyclically raises and lowers the downhole pump, and with each stroke, the downhole pump lifts well fluids toward the surface.

For example, FIG. 1 shows a sucker rod pump system 10 used to produce fluid from a wellbore W. A downhole pump 14 has a barrel 16 with a standing valve 24 located at the bottom. The standing valve 24 allows fluid to enter from the wellbore, but does not allow the fluid to leave. Inside the pump barrel 16, a plunger 20 has a traveling valve 22 located at the top. The traveling valve 22 allows fluid to move from below the plunger 20 to the production tubing 18 above, but does not allow fluid to return from the tubing 18 to the pump barrel 16 below the plunger 20. A driving source (e.g., a pump jack 11) at the surface connects by a rod string 12 to the plunger 20 and moves the plunger 20 up and down cyclically in upstrokes and downstrokes.

During the upstroke, the traveling valve 22 is closed, and any fluid above the plunger 20 in the production tubing 18 is lifted towards the surface. Meanwhile, the standing valve 24 opens and allows fluid to enter the pump barrel 16 from the wellbore. The highest point of the plunger's motion is typically referred to as the "top of stroke" (TOS), while the lowest point of the pump plunger's motion is typically referred to as the "bottom of stroke" (BOS).

At the TOS, the standing valve 24 closes and holds in the fluid that has entered the pump barrel 16. Additionally, at the TOS, the weight of the fluid in the production tubing 18 is supported by the traveling valve 22 in the plunger 20 and, therefore, also by the rod string 12, which causes the rod string 12 to stretch.

During the downstroke, the traveling valve 22 initially remains closed until the plunger 20 reaches the surface of the fluid in the barrel 16. Sufficient pressure builds up in the fluid below the traveling valve 22 to balance the pressure. The build-up of pressure in the pump barrel 16 reduces the load on the rod string 12 so that the rod string 12 relaxes.

This process takes place during a finite amount of time when the plunger 20 rests on the fluid, and the pump jack 11 at the surface allows the top of the rod string 12 to move downward. The position of the pump plunger 20 at this time is known as the "transfer point" because the load of the fluid column in the production tubing 18 is transferred from the traveling valve 22 to the standing valve 24. This results in a rapid decrease in load on the rod string 12 during the transfer.

After the pressure balances, the traveling valve 22 opens and the plunger 20 continues to move downward to its lowest position (i.e., the BOS). The movement of the plunger 20 from the transfer point to the BOS is known as the "fluid stroke" and is a measure of the amount of fluid lifted by the pump 14 on each stroke. In other words, the portion of the pump stroke below the transfer point may be interpreted as the percentage of the pump stroke containing fluid, and this percentage corresponds to the pump's fillage. Thus, the transfer point can be computed using a pump fillage calculation.

If there is sufficient fluid in the wellbore, the pump barrel 16 may be completely filled during an upstroke. Yet, under some conditions, the pump 14 may not be completely filled with fluid on the upstroke so there may be a void left between the fluid and the plunger 20 as it continues to rise. Operating the pump system 10 with only a partially filled pump barrel 16 is inefficient and, therefore, undesirable. In this instance, the well is said to be "pumped off," and the condition is known as "pounding," which can damage various components of the pump system. For a pumped off well, the transfer point most likely occurs after the TOS of the plunger 20.

Typically, there are no sensors to measure conditions at the downhole pump 14, which may be located thousands of feet underground. Instead, numerical methods are used calculate the position of the pump plunger 20 and the load acting on the plunger 20 from measurements of the position and load for the rod string 12 at the pump jack 11 located at the surface. These measurements are typically made at the top of the polished rod 28, which is a portion of the rod string 12 passing through a stuffing box 13 at the wellhead. A pump controller 26 is used for monitoring and controlling the pump system 10.

To efficiently control the reciprocating pump system 10 and avoid costly maintenance, a rod pump controller 26 can gather system data and adjust operating parameters of the system 10 accordingly. Typically, the rod pump controller 26 gathers system data such as load and rod string displacement by measuring these properties at the surface. While these surface-measured data provide useful diagnostic information, they may not provide an accurate representation of the same properties observed downhole at the pump. Because these downhole properties cannot be easily measured directly, they are typically calculated from the surface-measured properties.

Methods for determining the operational characteristics of the downhole pump 20 have used the shape of the graphical representation of the downhole data to compute various details. For example, U.S. Pat. No. 5,252,031 to Gibbs, entitled "Monitoring and Pump-Off Control with Downhole Pump Cards," teaches a method for monitoring a rod pumped well to detect various pump problems by utilizing measurements made at the surface to generate a downhole pump card. The graphically represented downhole pump card may then be used to detect the various pump problems and control the pumping unit. Other techniques for determining operational characteristics are disclosed in U.S. Patent Publication Nos. 2011/0091332 and 2011/0091335, which are both incorporated herein by reference in their entireties.

B. Everitt-Jennings Method

In techniques to determine operational characteristics of a sucker rod pump system 10 as noted above, software analysis computes downhole data (i.e., a pump card) using position and load data measured at the surface. The most accurate and popular of these methods is to compute the downhole card from the surface data by solving a one-dimensional damped wave equation, which uses surface position and load as recorded at the surface.

Various algorithms exist for solving the wave equation. Snyder solved the wave equation using a method of characteristics. See Snyder, W. E., "A Method for Computing Down-Hole Forces and Displacements in Oil Wells Pumped With Sucker Rods," Paper 851-37-K, 1963. Gibbs employed separation of variables and Fourier series in what can be termed the "Gibb's method." See Gibbs, S. G. et al., "Computer Diagnosis of Down-Hole Conditions in Sucker Rod Pumping Wells," JPT (January 1996) 91-98; Trans., AIME, 237; Gibbs, S. G., "A Review of Methods for Design and Analysis of Rod Pumping Installations," SPE 9980, 1982; and U.S. Pat. No. 3,343,409.

In 1969, Knapp introduced finite differences to solve the wave equation. See Knapp, R. M., "A Dynamic Investigation of Sucker-Rod Pumping," MS thesis, U. of Kansas, Topeka (January 1969). This is also the method used by Everitt and Jennings. See Everitt, T. A. and Jennings, J. W., "An Improved Finite-Difference Calculation of Downhole Dynamometer Cards for Sucker-Rod Pumps," SPE 18189, 1992; and Pons-Ehimeakhe, V., "Modified Everitt-Jennings Algorithm With Dual Iteration on the Damping Factors," 2012 SouthWestern Petroleum Short Course. The Everitt-Jennings method has also been implemented and modified by Weatherford International. See Ehimeakhe, V., "Comparative Study of Downhole Cards Using Modified Everitt-Jennings Method and Gibbs Method," Southwestern Petroleum Short Course 2010.

To solve the one-dimensional wave equation, the Everitt-Jennings method uses finite differences. The rod string is divided into M finite difference nodes of length $L_i$ (ft), density $\rho_i$ (lbm/ft$^3$) and area $A_i$ (in$^2$). If we let u=u(x, t) be the displacement of position x at time t in a sucker rod pump system, the condensed one-dimensional wave equation reads:

$$v^2 \frac{\partial^2 u}{\partial x^2} = \frac{\partial^2 u}{\partial t^2} + D \frac{\partial u}{\partial t} \quad (1)$$

where the acoustic velocity is given by:

$$v = \sqrt{\frac{144 E g}{\rho}}$$

and D represents a damping factor.

The first and second derivatives with respect to time are replaced by the first-order-correct forward differences and second-order-correct central differences. The second derivative with respect to position is replaced by a slightly rearranged second-order-correct central difference.

In the method, the damping factor D is automatically selected by using an iteration on the system's net stroke (NS) and the damping factor D. The damping factor D can be computed by the equation:

$$D = \frac{(550)(144\,g)}{\sqrt{2}\,\pi} \frac{(H_{PR} - H_H)\tau^2}{(\Sigma \rho_i A_i L_i) S^2} \quad (2)$$

Where $H_{PR}$ is the polished rod horsepower (hp), S is the net stroke (in), $\tau$ is the period of one stroke (sec.), and $H_{HYD}$ is the hydraulic horsepower (hp) obtained as follows:

$$H_{HYD} = (7.36 \cdot 10^{-6}) Q \gamma F_l \quad (3)$$

where Q is the pump production rate (B/D), $\gamma$ is the fluid specific gravity, and $F_l$ is the fluid level (ft). The pump production rate is given by:

$$Q = (0.1166)(SPM) S d^2 \quad (4)$$

where SPM is the speed of the pumping unit in strokes/minute, and d is the diameter of the plunger.

Additional details on the derivation of the damping factor D in equation (2) and the original iteration on the net stroke and damping factor algorithm are provided in Everitt, T. A. and Jennings, J. W., "An Improved Finite-Difference Calculation of Downhole Dynamometer Cards for Sucker-Rod Pumps," SPE 18189, 1992.

A modified Everitt-Jennings method also uses finite differences to solve the wave equation. As before, the rod string is discretized into M finite difference elements, and position and load (including stress) are computed at each increment down the wellbore. Then, as shown in FIG. 2, an iteration is performed on the net stroke and damping factor, which automatically selects a damping factor for each stroke.

The wave equation is initially solved to calculate the downhole card using surface measurements and an initial damping factor D set to 0.5 (Block 42). The initial net stroke $S_0$ is determined from the computed card, and the fluid level in the well is calculated (Block 44). At this point, a new damping factor D is calculated from equation (2) (Block 46) and so forth, and the downhole card is again computed with the new damping factor D (Block 48). Based on the recalculated downhole card, a new net stroke S is determined (Block 50).

At this point, a check is then made to determine whether the newly determined net stroke S is close within some tolerance C of the initial or previous net stroke (Decision 52). If not, then another iteration is needed, and the process 40 returns to calculating the damping factor D (Block 46). If the newly determined net stroke is close to the previously determined net stroke (yes at Decision 52), then the iteration for determining the net stroke can stop, and the process 40 continues on to iterate on the damping factor D using the converged net stroke S (Block 54). The downhole data is then calculated using the newly calculated damping factor D (Block 56), and the pump horsepower $H_{Pump}$ is then calculated (Block 58).

At this point, a check is made to see if the pump horsepower $H_{pump}$ is close within some tolerance to the hydraulic horsepower $H_{hyd}$ (Decision 60). If so, then the process 40 ends as successfully calculating the downhole pump card with converged net stroke and damping factor D (Block 62). If the pump horsepower $H_{pump}$ and the hydraulic horsepower $H_{hyd}$ are not close enough (no at Decision 60), then the process 40 adjusts the current damping factor D by a ratio of the pump horsepower $H_{Pump}$ and the hydraulic horsepower $H_{Hyd}$ (Block 64). The process 40 of calculating the pump card with this adjusted damping factor D is repeated until the values for the pump and hydraulic horsepower HPump and HHyd are close within the specified tolerance (Blocks 56 through 64).

The advantage of the automatic iteration on the net stroke and the damping factor D as set forth above is that the damping factor D is adjusted automatically without human intervention. Thus, users managing a medium group to a large group of wells do not have to spend time manually adjusting the damping factor D as may be required by other methods.

C. Deviated Well Model

As noted above, most of the methods presently used to compute downhole data using surface position and load as recorded by a dynamometer system at the surface rely on a vertical-hole model that does not take into consideration deviation of the well. For example, FIG. 3A schematically shows a vertical model 30 of a vertical wellbore having tubing 18 with a rod string 28 disposed therein. With the well model 30 being vertical, the only relevant friction forces are of viscous in nature. The viscous friction $F_v$ is the result of viscous forces arising in the annular space during a pumping cycle, which are proportional to the velocity of the axial displacement u.

However, when dealing with a deviated wellbore such as shown in a deviated model 32 shown somewhat exaggerated in FIG. 3B, mechanical friction $F_m$ arises from the contact between the tubing 18, the rod string 28, and the couplings 29. Even though those forces $F_m$ can be ignored when the well is mostly vertical, they have to be accounted for when the well is deviated. If the algorithm used to compute the downhole data does not take into consideration the mechanical friction $F_m$ for a deviated well, the resulting downhole card can appear distorted. This condition cannot be helped by changing the viscous damping factor D in the wave equation.

Thus, the vertical model is not well-suited for calculating downhole data when the sucker rod pump system 10 is used in a deviated well. Primarily, the dynamic behavior of the rod string 28 is different for deviated wells than for vertical wells. Indeed, in vertical wells, the rod string 28 is assumed to not move laterally. In deviated wells, however, mechanical friction $F_m$ becomes non-negligible because there is extensive contact between the rod string 28, the couplings 29, and the tubing 18. Also, since the well is deviated, some sections of the rod string 28 can be bent between two couplings 29 in the middle of a dog leg turn, which introduces the concept of curvature of the rod string 28 as well.

The above equations discussed for the wave equation only consider friction forces of a viscous nature in the vertical model. Yet, the friction forces particular to deviated wells are of viscous and mechanical nature, as detailed above. Although mechanical friction $F_m$ has generally been ignored, it has since been addressed. For example, to deal with the Coulombs friction that results from the mechanical friction in a deviated well, the most well-known technique have been disclosed by Gibbs and Lukasiewicz. See Gibbs, S. G., "Design and Diagnosis of Deviated Rod-Pumped Wells," SPE Annual Technical Conference and Exhibition, Oct. 6-9, 1991; and Lukasiewicz, S. A., "Dynamic Behavior of the Sucker Rod String in the Inclined Well," Production Operations Symposium, Apr. 7-9, 1991, both of which are incorporated herein by reference.

To deal with mechanical friction in deviated wells, Gibbs modified the wave equation by adding a Coulombs friction term to it. For example, U.S. Pat. No. 8,036,829 to Gibbs et al. includes a term C(x) in the wave equation that represents the rod and tubing drag force. In this solution, Gibbs describes a way to calculate the Cartesian coordinates of a rod string and how to relate this to a normalized friction factor that is then used to compute the Coulombs friction term. By contrast, Lukasiewicz derived equations for axial and transverse displacement of the rod element, creating a system of coupled differential equations.

D. Equations for Axial and Transverse Displacement of Rod Element

As recognized in Lukasiewicz, a rod string in a deviated well moves longitudinally up and down (i.e., axially) and also moves laterally (i.e., transversely). Thus, the behavior of the axial stress waves as well as the transverse stress waves of a rod element can be analyzed to better characterize the behavior of the rod string 28 in the deviated well.

To that end, FIG. 3C diagrams dynamic behavior of a rod element 34 of a sucker rod pump system for a deviated well model 32. This diagram shows the various forces acting on the rod element 34 in the axial and transverse directions. As represented here, u(s, t) is the axial displacement of the rod element 34 of length ds, and v(s, t) is the transverse displacement of the rod element 34. The radius of curvature $R_\varphi$ can be calculated along with the Cartesian coordinates of the wellbore path using a deviation survey. Several methods are available for such calculations, such as a minimum curvature method or a radius-of-curvature method, as disclosed in Gibbs, S. G., "Design and Diagnosis of Deviated Rod-Pumped Wells", SPE Annual Technical Conference and Exhibition, Oct. 6-9, 1991, which is incorporated herein by reference.

In the diagram of the forces acting on the rod element 34, the radius of curvature $R_\varphi$ is displayed as an arrow going from the center of the curvature to the rod element 34 of length ds. The axial force denoted F acts upwards and downwards on the rod element 34. The axial force, therefore, has an axial component as well as a transverse component. The Coulombs friction force $F_t$ opposes the movement of the rod element 34 at the point of contact between the rod element 34 and the tubing 18. The weight W is shown as the gravitational force pulling downward on the rod element 34. A normal force N acts perpendicularly on the rod element 34 facing the center of curvature. Both the weight W and the normal force N have axial and transverse components as well.

Thus, the axial direction (i.e., the direction tangential to the rod) can be characterized with the following axial equation of motion:

$$\frac{\partial F}{\partial s} - A\gamma \frac{\partial^2 u}{\partial t^2} + \gamma g A \cos\theta - D\frac{\partial u}{\partial t} - F_t = 0, \tag{1}$$

Here, F is the axial force in the rod, u(t) is the axial displacement, A is the rod cross-sectional area, γ is the density, g is the acceleration of gravity, θ is the angle of inclination, D is the viscous damping coefficient, $F_t$ is the friction force from the tubing 18, s is the length measured along the curved rod, and t is time.

As noted above, the force $F_t$ is the Coulombs friction force, which is a nonlinear force that tends to oppose the motion of bodies within a mechanical system. Coulombs friction is representative of dry friction, which resists relative lateral motion of two solid surfaces in contact. The relative motion of the rod string 28, tubing 18, and couplings 18 as seen in FIG. 1 pressing against each other is a source of energy dissipation when the well is pumping.

In the transverse direction, the transverse equation of motion can be characterized as:

$$EI\frac{\partial^2}{\partial s^2}\left[\frac{\partial^2 v}{\partial s^2} + \frac{1}{R_\varphi}\right] + \gamma A \frac{\partial^2 v}{\partial t^2} + n_t + n_p + D_t \frac{\partial v}{\partial t} + \frac{F}{R} - \gamma g A \sin\theta = 0, \tag{2}$$

-continued $$EI\frac{\partial^4 v}{\partial s^4} + EI\frac{\partial^2}{\partial s^2}\frac{1}{R_\varphi} + \gamma A\frac{\partial^2 v}{\partial t^2} + n_t + n_p + D_t\frac{\partial v}{\partial t} + \frac{F}{R} - \gamma Ag\sin\theta = 0.$$

Here, EI is the bending stiffness, E is Young's modulus of elasticity, I is the bending moment, $D_t$ is the viscous damping factor in the transverse direction, $n_t$ is the transverse normal force from the tubing 18, an $n_p$ is the transverse normal force from the liquid under pressure p, and $$\frac{1}{R}$$

is an actual radius of curvature given by $$\frac{1}{R} = \frac{1}{R_\varphi} + \frac{\partial^2 v}{\partial s^2}.$$

As demonstrated by Lukasiewicz, the axial force can be introduced into the axial equation of motion (1) to give:

$$\frac{\partial^2 u}{\partial s^2} + \frac{\partial v}{\partial s}\cdot\frac{\partial^2 v}{\partial s^2} - \frac{1}{a^2}\frac{\partial^2 u}{\partial t^2} - \frac{D}{AE}\frac{\partial u}{\partial t} + \frac{\gamma g}{E}\cos\theta - \frac{F_t}{AE} = 0, \quad (3)$$

Here, α is the acoustic velocity of the rod element 34. Furthermore, by assuming that the rod element 34 lies on the tubing 18 in between couplings 29, the axial equation of motion (1) can be written as:

$$\frac{\partial^2 u}{\partial s^2} - \frac{1}{a^2}\frac{\partial^2 u}{\partial t^2} - \frac{D}{AE}\frac{\partial u}{\partial t} + \frac{\mu}{R}\frac{\partial u}{\partial s} + \frac{\gamma g}{E}\cos\theta - \frac{\mu}{E}(\gamma g\sin\theta) = 0, \quad (4)$$

Additional details on these equations and the axial force are disclosed in Lukasiewicz, S. A., "Dynamic Behavior of the Sucker Rod String in the Inclined Well," Production Operations Symposium, Apr. 7-9, 1991, which has been incorporated herein by reference.

As can be seen, axial equation of motion (3) uses the surface position of the rod string to calculate the downhole position at each finite difference node down the wellbore until the node right above the downhole pump. The axial and transverse equations of motion (3) and (2) are combined to form a system of two coupled non-linear differential equations of fourth order.

It is important to note that Coulombs friction (i.e., the mechanical friction that arises from the contact between the rods 28, tubing 18, and couplings 29) can be consequential in a deviated well and cannot be simulated using viscous damping. In particular, the Coulombs friction forces are not proportional to the velocity of the rod element as the viscous friction forces are. In some cases, the viscous damping factor can be increased to remove extra friction, but the downhole friction due to mechanical cannot be removed. If the viscous damping is pushed too far, the effects of the mechanical friction can look like they have been removed, but in reality the downhole data no longer represent what is happening at the downhole pump.

In equation (2), the second term is nonlinear and represents the effect of the vertical deflection on the axial displacement. It is noted that the equations given above are the same equations presented by Lukasiewicz, and that the model developed by Gibbs ignores the transverse movement of the rod string 28.

Being able to treat the mechanical friction when dealing with deviated wells has been a growing concern in the industry. Often, users try to remedy the downhole friction on a downhole card by modifying the viscous damping factor or by adding a drag force term (as done by Gibbs). Yet, this can essentially falsify the downhole results and can hide downhole conditions.

Although the prior art (and especially Lukasiewicz) has characterized the equations for motion of a rod string in a deviated well, practical techniques for performing the calculations are needed. This is especially true when the calculations are performed by a pump controller or other processing device, which may have limited processing capabilities.

E. Boundary Conditions in Solution

Many operators rely on commercially available software programs to calculate the operation of a rod string in a well with a surface mounted pumping unit. The rods extending into the well are reciprocated by the pump jack at stroke rates from one (1) to as high as sixteen (16) strokes per minute. The software is used to select the most appropriate rod string to use as well as to define operational characteristics of the downhole pump. To achieve the latter requirement, advanced mathematical models are used. For a number of years, the preferred solution to the mathematical models has included solving what is commonly called the wave equation.

By measuring the dynamic loads and the position of the rod string at the top of the rod string and applying other factors, both known and estimated, the wave equation can be very useful in modeling the operation of the system because the solution to the wave equation provides valuable operational characteristics of the downhole pump, such as: pump fillage, gas lock, and whether the well is in a pumped off condition, to name a few. This information helps the operator to better understand how and when to modify the operation of the surface pump to better control the pumping operations.

There are still challenges in applying the wave equation solution to the rod string. The boundary conditions that are used influence the accuracy of the mathematical model solution. Of particular interest are the viscous and Coulomb friction factors in the boundary conditions. Both of these factors are a function of the interaction between the wellbore geometry and the tubing and the rod string position. These factors become more important and are more difficult to define as the wellbore trajectory becomes tortuous, as is the case in many deviated wells.

The subject matter of the present disclosure is directed to overcoming, or at least reducing the effects of, one or more of the problems set forth above.

BRIEF DESCRIPTION OF THE DRAWINGS

FIG. 3A diagrams a vertical well model.

FIG. 3B diagrams a deviated well model.

FIG. 3C diagrams dynamic behavior of a rod element of a sucker rod pump system for a deviated well.

DETAILED DESCRIPTION OF THE DISCLOSURE

According to the present disclosure, a pump system and process computes downhole data from surface data by solving a wave equation, such as the wave equation of the modified Everitt-Jennings algorithm. The wave equation takes both viscous damping and Coulomb friction into consideration. If the well is substantially vertical, the mechanical friction from the Coulomb friction coefficient is negligible, and the obtained downhole data may be relatively accurate. However, in a deviated or horizontal wellbore, the mechanical friction between the rods, couplings, and tubing needs to be considered carefully. According to the present disclosure, the process refines the mechanical friction factors in the calculation of downhole data in deviated or horizontal wellbores.

To do this, the teachings of the present disclosure model the wellbore's trajectory, parameterizes the various deviated segments (build-ups, slants, drop-offs, etc.) in the modeled trajectory, maps the rod string to the modelled trajectory with its parameterized segments, and incrementally evaluates the position of the mapped rod string over time in order to compute drag forces and side loads experienced by the rod string during operation. These computed drag forces and side loads are then used in the solution of the modified wave equation to solve the surface load and position data and provide more accurate downhole position and load data.

The concepts as disclosed herein use a more definitive methodology in defining the well trajectory, and the resulting position of the rod string inside the tubing is more precise. These techniques allow the viscous and Coulomb friction factors to be determined with greater accuracy. This results in other improvements to the wave equation solutions that will be described herein.

A. Process

Figure 1:
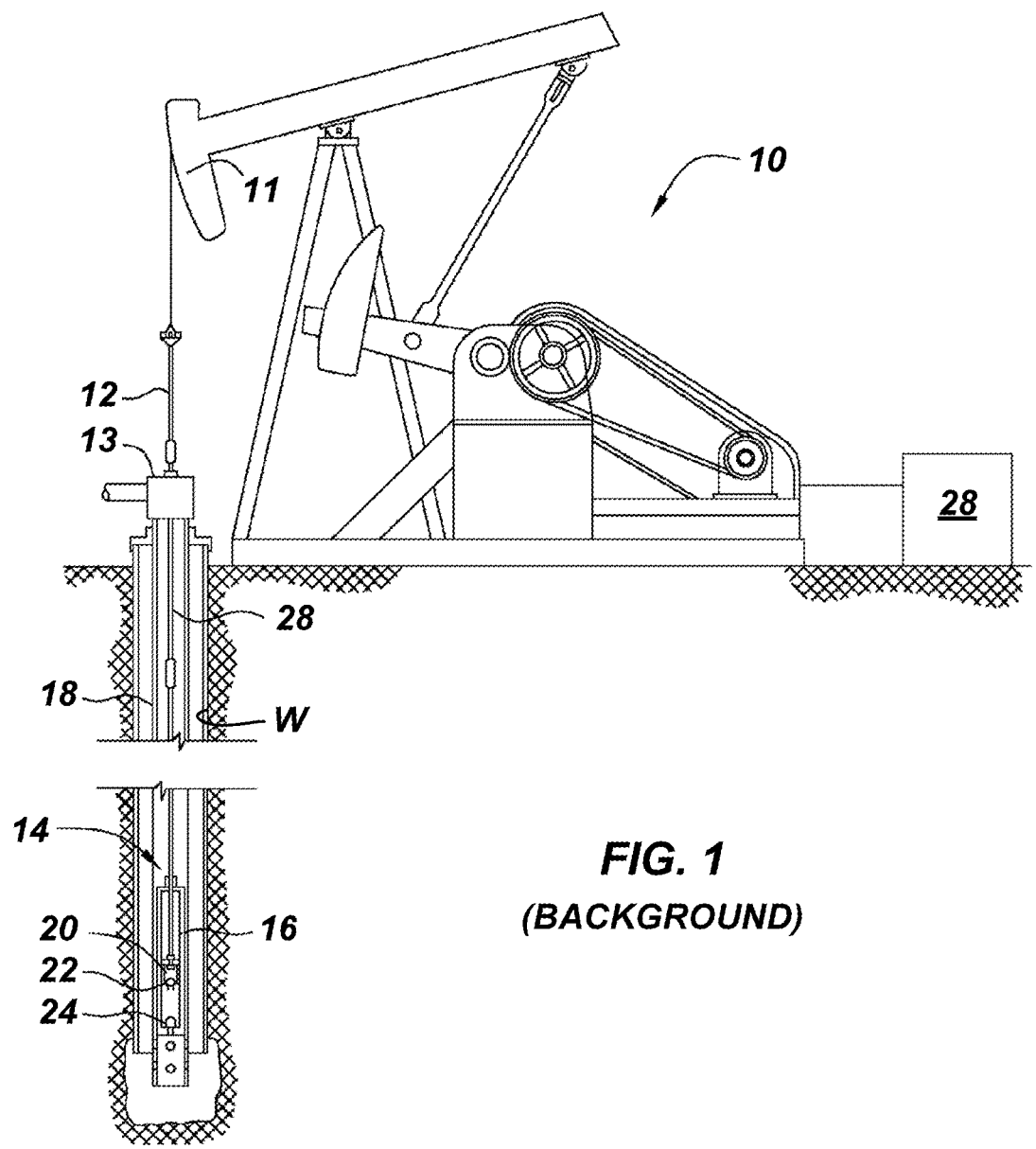
FIG. 1 illustrates a sucker rod pump system with a controller for controlling the system's pump.
Figure 2:
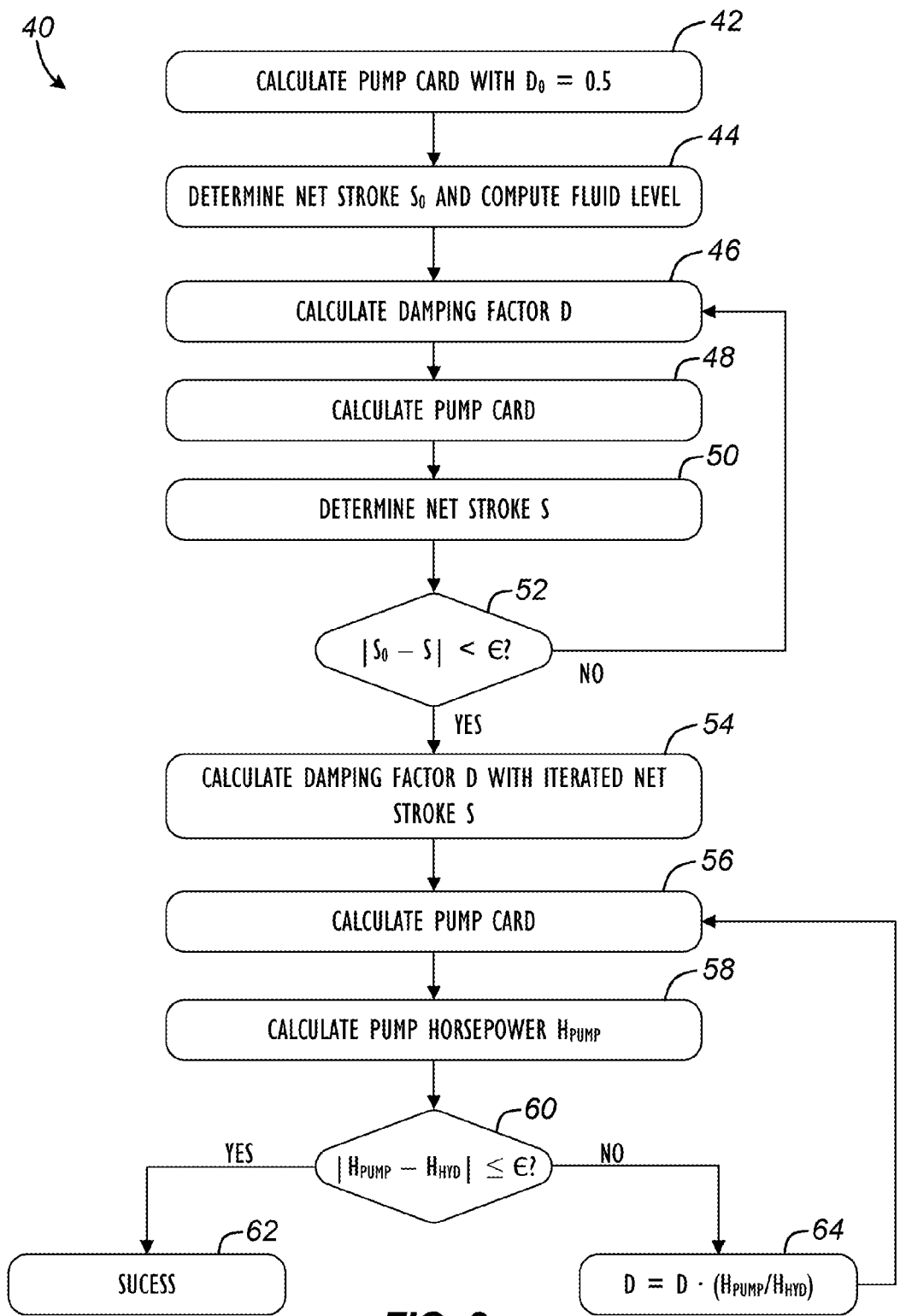
FIG. 2 illustrates iteration on netstroke and damping factor for the modified Everitt-Jennings algorithm to compute a pump card according to the prior art.
Figure 4:
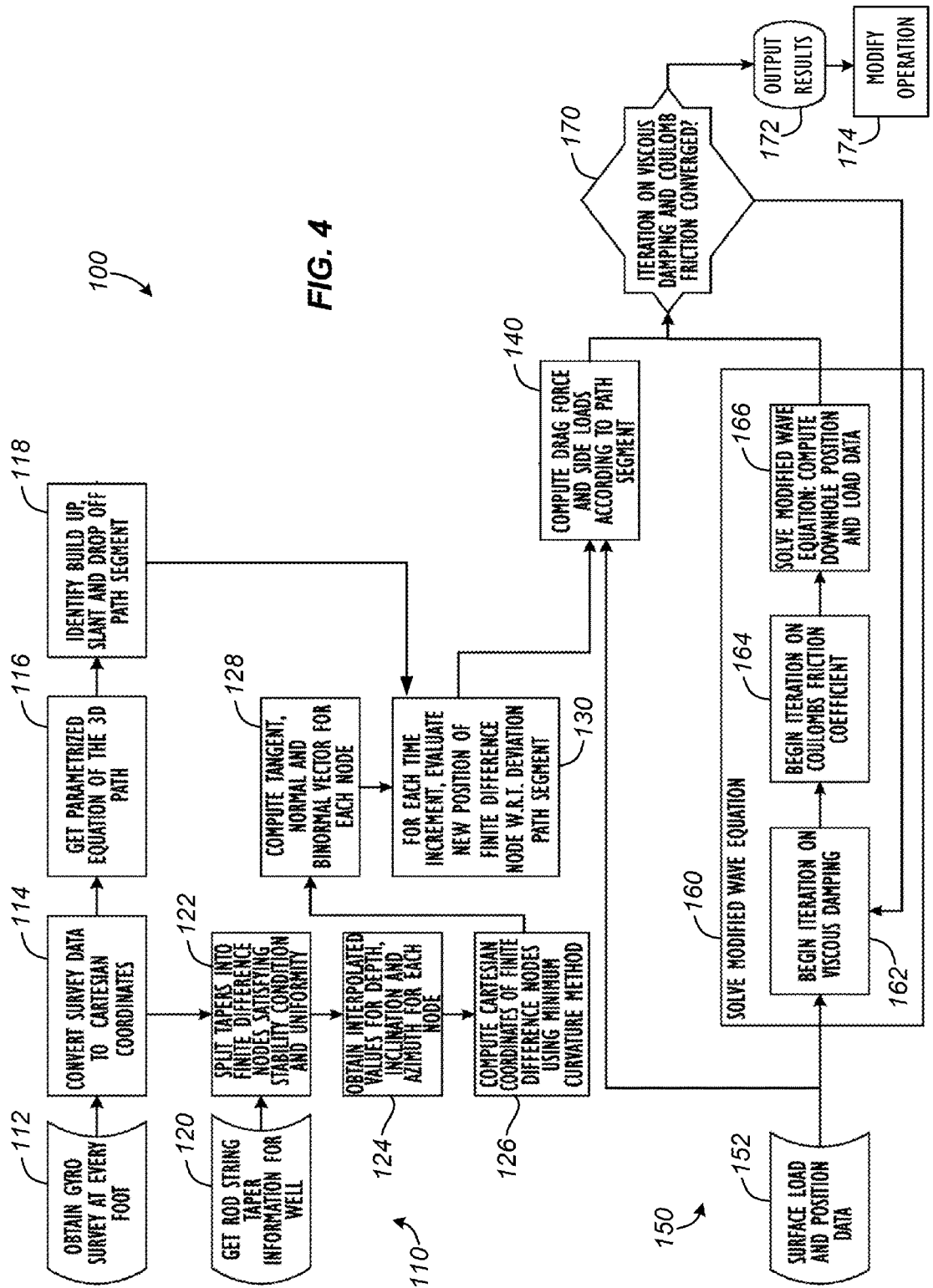
FIG. 4 illustrates a flowchart of a process for calculating downhole data for a sucker rod pump system in a deviated well.

Referring now to FIG. 4, a process 100 is illustrated in flowchart form for solving surface load and position data obtained with a pump system to provide more accurate downhole position and load data. The pump system can be similar to that disclosed herein, such as reference in FIG. 1 and elsewhere. The process 100 involves modeling steps 110 and solution steps 150, which are fed into one another and comparatively handled (Decision 170). In the modeling steps 110, the spatial position of the system's rod string is mapped onto wellbore survey data. This provides a direct representation of contact points between the rod string and the wellbore tubing both during the upstroke and the downstroke of the system's operation. The viscous damping and Coulomb friction and the resultant drag forces are directly calculated at each survey point, and the viscous and Coulomb friction coefficients are interpolated in between survey points.

In particular, the modeling steps 150 involve initially obtaining a survey of a wellbore (Block 112). A particularly useful type of survey is a gyro survey that surveys the wellbore at preferably every foot or so. To then map the wellbore, the survey data is converted into Cartesian coordinates for every measured point (Block 114), and the 3-dimensional path of the wellbore is made into a parameterized equation (Block 116). Typically surveys have one (1) foot intervals between the various survey points so interpolating between the survey points is performed to more fully represent the spatial position. In the process 110, the 3D representation of the wellbore from the parameterized equation can then be used to predict potential contact points between the tubing and the rod string. In particular, analyzing the 3-D parameterized equation of the wellbore can identify the various vertical segments, horizontal segments, build-up segments, slant segments, drop-off segments, and the like of the wellbore's path (Block 118).

Figure 5:
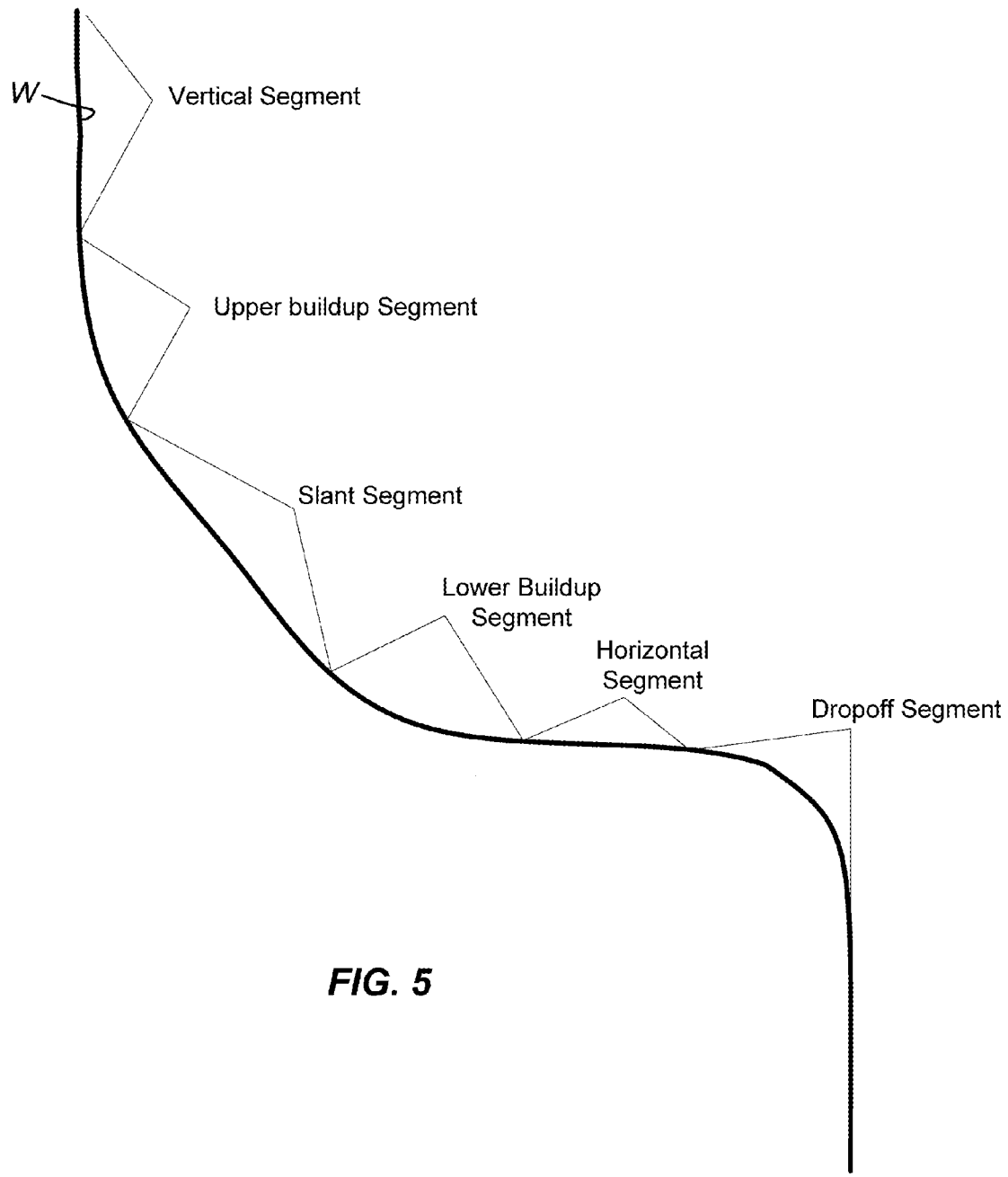
FIG. 5 diagrams various segments of a deviated well model.

For reference, FIG. 5 diagrams a wellbore W in two-dimensions having various types of segments, including vertical segments, horizontal segments, build-up segments, slant segments, drop-off segments, and the like of the wellbore's path. An actual wellbore would have a trajectory in three-dimensions. A rod string disposed in such a deviated wellbore W would generally follow the same trajectory. Because the rod string has a taper, moves in the wellbore W, is flexible, etc., additional modeling is performed in the modeling steps 110.

Because the 3-D parameterized equation may be made of the wellbore W without casing, tubing, rod string, and the like, which will ultimately be part of the final system, additional modeling steps may be performed to create the model to account for changes related to the casing, tubing, rod string, etc. Although the mapping results in a more accurate representation, it can be appreciated that there may still be some spatial positional inconsistencies between the wellbore profile, the tubing, and the rod string. The survey may be completed when there are no metallic tubular components in the wellbore W. Inserting the casing followed by the tubing will result in slight differences. Similarly, the rod string, which is much more flexible than the casing or tubing, will tend to follow a similar trajectory, but the rod string will be displaced due to the string's flexibility and its dynamic movement in the tubing string as the pump jack reciprocates it. Therefore, a calculation is required to enable the side loading to be determined, which is used to calculate the Coulomb friction forces and ultimately the drag for the rod string.

To do this, the rod string for the system is mapped to the survey data. First, the tapered rod string for the system is interpolated from the deviation survey using polynomial interpolation (Block 120), and the tapered rod string is split into finite difference nodes satisfying stability condition sand uniformity (Block 120). To obtain information for the rod string taper in the wellbore (Block 120), algorithms and commercially available software analysis can be used to determine the appropriate rod string taper information. In general, the available analysis determines such details as how the weight of the sucker rod string is distributed along its length, how tapered increments of increasing diameters from bottom to surface should be distributed along the length, etc. Using the rod string taper information (Block 120) and the Cartesian converted survey data (Block 114), the process 110 splits or divides the tapers of the rod string into a plurality of finite difference nodes satisfying stability conditions and uniformity (Block 122), and interpolated values are obtained for depth, inclination, and azimuth for each node (Block 124).

To map the nodes to the Cartesian system of the parameterized wellbore equation of Block 116, Cartesian coordinates are computed for the finite difference nodes of the rod string using a minimum curvature method (Block 126). At this point, more detail of the rod string can be interpolated. In particular, Tangent, Normal, and BiNormal vectors are computed for each node of the rod string (Block 128).

Having the 3-D parameterized equation of the wellbore with its build-up, slant, and drop-off path segments identified (118) and having the tapered rod string mapped to the wellbore (128), the process 100 determines how the position of the finite difference nodes of the rod string changes with respect to the deviation path segments at the nodes. In particular, for each time increment over a span of time, new positions of a finite difference node of the rod string can be evaluated with respect to the particular deviation path segment in the parameterized wellbore where that particular node is situated (Block 130).

In this way, the distance traveled by every finite difference node is computed for each time increment. For example, a particular node may be situated at a build-up segment of the wellbore (see e.g., FIG. 5) so that the movement of the node over time in upstrokes and downstrokes results in particular positions with respect to this build-up segment. More or less of the rod string may contact the casing wall at the build-up segment, and the point of contact between the rod string and casing may change over time.

Another node, however, may be situated at a drop-off segment of the wellbore (see e.g., FIG. 5) so that the movement of this node over time results in different positions with respect to this drop-off segment. The various finite difference nodes along the rod string are situated at the different types of segments in the parameterized wellbore so that the evaluated positions of the nodes can be determined with respect to their respective deviation segment to produce a comprehensive understanding of how the nodes of the rod string change position in the parameterized wellbore with all of its various deviations.

The wellbore survey and parameterization in Blocks 112 to 118 can provide a more direct way to determine the spatial position of the tubing and the rod string. Mapping the position of the two together is a much more accurate way to represent the contact points and will lead to a more direct calculation model for the viscous damping and Coulomb friction experienced by the rod string during operation of the system. As discussed below, these are factors that are used to define the boundary conditions when solving the wave equation.

Having an understanding of how the finite difference nodes of the rod string change position over time increments with respect to the deviation path segments of the parameterized wellbore (Block 130), the process 100 can use these modelled details when handling surface load and position data obtained during operation of the system. In particular, as the system operates and reciprocates the rod string to operate the pump, the surface load and position data is obtained (Block 152) so that the operation of the pump downhole can be calculated.

The measured data (152) is fed to both the model steps 110 and the solutions steps 150 having the modified wave equation (160). For the model steps 110, the rod string's movement with the strokes of the system occurring at time increments are used to compute forces (i.e., the drag forces and side loads) for the various path segments in the model (Block 140). Compute these forces experienced by the mapped rod string during operation relative to the path segments use force equations characterized for pulling out and running in the mapped rod string in the segments. Details related to these force equations are provided later with respect to FIGS. 7A-7D. The drag forces can be summed up for each time increment to give an overall Coulomb friction value for the system.

At the same time, the measured data (152) is fed to the modified wave equation (160) to calculate downhole position and load data of the system. The iterative solution (166) of the modified wave equation (160) can then be used as verification of the drag model (140) obtained in the modeling steps 110. Because the viscous and Coulomb friction forces are more accurately determined through this ultimate verification, the boundary conditions used for solving the wave equation (160) can be refined resulting in more accurate downhole pump operational characteristics. Furthermore, other factors may also be used to improve the boundary condition model which will also improve the wave equation solution.

As shown in FIG. 4, the modified wave equation (160) includes viscous damping and Coulomb friction terms (162, 164). In the solution, the finite difference nodes (found above in the modeling steps 150) are used with dual iteration on the viscous damping (Block 162) and the Coulomb friction coefficient (Block 164). As is known, the solution of the wave equation (160) relies on assumed boundary conditions of the viscous damping and Coulomb friction coefficient. Once the viscous and Coulomb friction forces are defined in the modeling steps 150, they can be included in the mathematical solution of the wave equation (160).

The solution (Block 166) of the modified wave equation (160) ultimately computes a representation of downhole load and position data for assessing downhole pump operating conditions, including: pump fillage, pump efficiency, pumped-off condition, gas displacement, fluid slippage, rod conditions, etc. Once the wave equation (160) is solved in the solution steps 150 and once the drag force and side loads have been computed (140) in the modeling steps 110, the process 100 determines whether iterations on viscous damping and coulomb friction have converged (Decision 170). If boundary conditions used in the solution of the wave equation (160) need to be changed due to poor convergence, the new values are input into the modified wave equation (160) for obtaining a new solution (166). Comparing the results in Decision 170 of the wave equation solution (160) to the measured forces (140) provides feedback regarding the accuracy of the model.

One form of solution for the calculations in (160) can be based on solutions disclosed in U.S. Pat. Pub 2013/0104645 entitled "Calculating Downhole Cards in Deviated Wells," which is incorporated herein by reference in its entirety. These disclosed solutions are suited for deviated wellbores and have transverse and axial equations of motion as well as other equations. For the present case, the calculations in (160) may use a modified form of one or more of the equations disclosed in US 2013/0104645 to suit the particulars of the present implementation.

Briefly, the Modified Wave equation for the disclosed Deviated Well Diagnostic techniques of the present disclosure is based on the equation:

$$\frac{\partial^2 u(x,t)}{\partial t^2} = v^2 \frac{\partial^2 u(x,t)}{\partial x} - c\frac{\partial u(x,t)}{\partial t} - Fc(x)$$

where Fc(x) is the Coulombs friction force opposing the movement of the rods.

The Coulombs friction force combines the side loads and the drag forces incurred during the pumping cycle. The computation of the drag forces initiates at the bottom of the rod string above the pump, using the maximum load principle, the concept of the maximum pulling load. This concept is based on the assumption that the greatest value of tensile stress in directional-well casing occurs during the pumping cycle.

As discussed herein, the three-dimensional path of the rod string must be characterized in order to identify the different segments that the rod string passes in the deviation survey, such as build-up segments, slanted segments, and drop-off segments. To do this, the three-dimensional path of the directional survey can be parametrized using polynomial interpolation into a curve:

$$C: r(t) = x(t)\vec{i} + y(t)\vec{j} + z(t)\vec{k}$$

The 3D-path is then analyzed to locate buildup, slant, drop-off, and other possible segments. In general, a drop-off segment is identified from a decreasing inclination with increasing depth, and a slant segment is identified with constant inclination with increasing depth. For its part, a build-up segment is identified from an increasing inclination with increasing depth. With respect to the build-up segment as shown in FIG. 5, for example, three separate cases can occur: upper, middle and lower. In the upper build-up segment, the rod string may be in contact with the upper side of the tubing 18 in the wellbore W. In the middle build-up segment which corresponds to a slant segment, the rod string may not be in contact with the tubing 18 at all. In the lower build-up segment, the rod string may be in contact with the bottom side of the tubing 18. Although not shown in FIG. 5 with the respect to the drop-off segment, comparable cases may occur as well depending on the trajectory of the wellbore W.

For each of the above segments, a different differential equation is solved for each of the pulling out and running in operations of the system to determine forces. In particular, the differential equation to be solved for a build-up segment can be characterized as:

$$\frac{dF_a}{d\alpha} = -f_b |WR\sin\alpha - F_a| \pm WR\cos\alpha$$

The differential equation to be solved for a slanted segment can be characterized as:

$$\frac{dF_a}{dl} = W(f_b\sin\alpha \pm \cos\alpha)$$

The differential equation to be solved for a drop-off segment can be characterized as:

$$\frac{dF_a}{d\alpha} = f_b(WR\sin\alpha + F_a) \pm WR\cos\alpha$$

where: $F_a$ is the axial force on the unit section in lbf;
$\Delta\alpha$ is the angle subtended by unit section at radius R;
$f_b$ is a friction factor;
W is weight of the unit section in lb/ft; and
R is the radius of curvature in ft.

Further details are provided in FIGS. 7A-7D, which illustrate forces for buildup, slant, and drop-off sections or segments according to the present disclosure.

Build-up Segment: The inclination of a build-up segment increases with increasing depth. The forces related to a unit section of the rod string within a build-up segment can be characterized by the forces depicted in FIG. 7A, where:
$F_a$=axial force on the unit section;
R=radius of curvature
$\Delta\alpha$=angle subtended by the unit section at radius R;
$F_n$=resultant normal force;
W=weight of the unit section; and
$f_b$=friction factor.

Here, the unit section is shown in contact with the upper side of the tubing in the wellbore. The drag force can be characterized as:

$$F_d = -f_b |\Delta\alpha WR \sin\alpha - F_a\Delta\alpha|$$

The incremental axial force for pulling out the unit section in the build-up segment can be characterized as:

$$\Delta F_a = |F_d| - \Delta\alpha WR \cos\alpha$$

Rearranged, this gives an equation in the form of:

$$\frac{dF_a}{d\alpha} + f_b F_a = WR(f_b\sin\alpha - \cos\alpha)$$

from which the axial force $F_a$ can be solved for pulling out.

The incremental axial force for running in the unit section of the rod string within the build-up segment can be characterized as:

$$\Delta F_a = |F_d| + \Delta\alpha WR \cos\alpha$$

Rearranged, this gives an equation in the form of:

$$\frac{dF_a}{d\alpha} + f_b F_a = WR(f_b\sin\alpha + \cos\alpha)$$

from which the axial force $F_a$ can be solved for running in.

Slant Segment: The inclination of a slant segment remains constant with increasing depth. The forces related to a unit section of the rod string within a slant segment can be characterized by the forces depicted in FIG. 7B. The angle of the slant a can be vertical, horizontal, or other value depending on the wellbore trajectory.

When there is no contact, the incremental axial force for pulling out the unit section in the slant segment can be characterized as:

$$\Delta F_a = -\Delta\alpha WR \cos\alpha$$

Rearranged, this gives an equation in the form of:

$$\frac{dF_a}{d\alpha} = -WR\cos\alpha$$

from which the axial force $F_a$ can be solved for pulling out.

The incremental axial force for running in a unit section of the rod string within the slant segment can be characterized as:

$$\Delta F_a = \Delta\alpha WR \cos\alpha$$

Rearranged, this gives an equation in the form of:

$$\frac{dF_a}{d\alpha} = WR\cos\alpha$$

from which the axial force $F_\alpha$ can be solved for running in.

With contact, the drag force can be characterized as:

$$F_d = f_b |\Delta l W \sin\alpha|$$

The incremental axial force for pulling out can be characterized as:

$$\Delta F_\alpha = f_b \Delta l W \sin\alpha - \Delta l W \cos\alpha$$

Rearranged, this gives an equation in the form of:

$$\frac{dF_a}{d\alpha} = W(f_b \sin\alpha - \cos\alpha)$$

from which the axial force $F_\alpha$ can be solved for pulling out.

The incremental axial force for running in can be characterized as:

$$\Delta F_\alpha = f_b \Delta l W \sin\alpha + \Delta l W \cos\alpha$$

Rearranged, this gives an equation in the form of:

$$\frac{dF_a}{d\alpha} = W(f_b \sin\alpha + \cos\alpha)$$

from which the axial force $F_\alpha$ can be solved for running in.

Lower Section: The forces related to a unit section of the rod string within a lower segment (i.e., a build-up segment in which the rod string is in contact with the lower side) can be characterized by the forces depicted in FIG. 7C.

The incremental axial force for pulling out a unit section of the rod string in the lower segment can be characterized as:

$$\Delta F_\alpha = f_b (\Delta\alpha WR \sin\alpha - F_{\alpha\alpha}\Delta\alpha) - WR\cos\alpha$$

Rearranged, this gives an equation in the form of:

$$\frac{dF_a}{d\alpha} + f_b F_a = f_b WR\sin\alpha - WR\cos\alpha$$

from which the axial force $F_\alpha$ can be solved for pulling out.

The incremental axial force for running in a unit section of the rod string within the lower segment can be characterized as:

$$\Delta F_\alpha = f_b (\Delta\alpha WR \sin\alpha - F_\alpha\Delta\alpha) + WR\cos\alpha$$

Rearranged, this gives an equation in the form of:

$$\frac{dF_a}{d\alpha} + f_b F_a = f_b WR\sin\alpha + WR\cos\alpha$$

from which the axial force $F_\alpha$ can be solved for running in.

Drop-Off Section: Inclination in a drop-off section decreases with increasing depth. The forces related to a unit section of the rod string within a drop-off segment can be characterized by the forces depicted in FIG. 7D. Here, the rod string is depicted as being in contact with the lower side of the tubing in the wellbore, but comparable analysis could be provided for contact of the rod string in contact with the upper side in such a drop-off segment. In the present example, the incremental axial force can be characterized as:

$$\Delta F_\alpha = |F_d| \pm \Delta\alpha WR \cos\alpha \approx f_b(\Delta\alpha WR \sin\alpha + F_\alpha\Delta\alpha) \pm \Delta\alpha WR \cos\alpha$$

The incremental axial force for pulling out a unit section of the rod string in the drop-off segment can be characterized as:

$$\Delta F_\alpha = f_b(\Delta\alpha WR \sin\alpha + F_\alpha\Delta\alpha) - \Delta\alpha WR \cos\alpha$$

Rearranged, this gives an equation in the form of:

$$\frac{dF_a}{d\alpha} - f_b F_a = WR(f_b \sin\alpha - \cos\alpha)$$

from which the axial force $F_\alpha$ can be solved for pulling out.

The incremental axial force for running in a unit section of the rod string within the drop-off segment can be characterized as:

$$\Delta F_\alpha = f_b(\Delta\alpha WR \sin\alpha + F_\alpha\Delta\alpha) + \Delta\alpha WR \cos\alpha$$

Rearranged, this gives an equation in the form of:

$$\frac{dF_a}{d\alpha} - f_b F_a = WR(f_b \sin\alpha + \cos\alpha)$$

from which the axial force $F_\alpha$ can be solved for running in.

Comparable equations can be configured for other types of segments in a deviated wellbore, such as a vertical segment and a horizontal segment, which can simply be characterized as types of slant segments with different inclinations. Moreover, the above equations may be modified to fit the 3-dimensional case of the present disclosure by further accounting for deviations in an additional azimuthal plane. Further details related to these equations as they related to casing design can be found in S. S. Rahman and G. V. Chilingarian, *Casing Design Theory and Practice*, "Chapter 4: Casing Design for Special Applications," Elsevier 1995, pgs. 177-193, which is incorporated herein by reference.

The feedback from the comparison in Decision 170 can offer additional benefits. The wave equation (160) has been used for some time to define the rod string reactions so that numerous calculations have been performed and case histories have been saved in a common format. These case histories provide a rich field of historical data to compare current results against. The comparison in the Decision 170 can compare historical data from a previous case history to current data from the current calculations, and the differences between the two models may suggest an otherwise unexpected event is occurring. This lead to a refined feedback representation thereby improving the downhole pump operation further. It will be appreciated by one skilled in the art that numerous comparison and refinement activities can be performed in this regard.

Once acceptable convergence occurs, the process 100 outputs results (Block 172). At a minimum, the results can be displayed in a graphical representation for operators to review. For example, the process 100 disclosed herein, when applied as a diagnostic tool, may generate a downhole card, data or information, which present downhole position and load data of the pump to assess the pumps operation and is particularly useful for controlling wells. The output results 172 can be further used to manually or automatically modify a parameter or operation of the system. For example, at least one operational parameter of the system can be modified by an operator or by the system based on the generated downhole card. The actuator (i.e., motor) of the system can be stopped or its speed can be adjusted. Alternatively, the components of the system may need to be changed, such as installing a different downhole pump, altering the rod string used, etc.

B. Pump System

As will be appreciated, teachings of the present disclosure can be implemented in digital electronic circuitry, computer hardware, computer firmware, computer software, or any combination thereof. Teachings of the present disclosure can be implemented in a computer program product tangibly embodied in a machine-readable storage device for execution by a programmable processor so that the programmable processor executing program instructions can perform functions of the present disclosure.

Figure 6A:
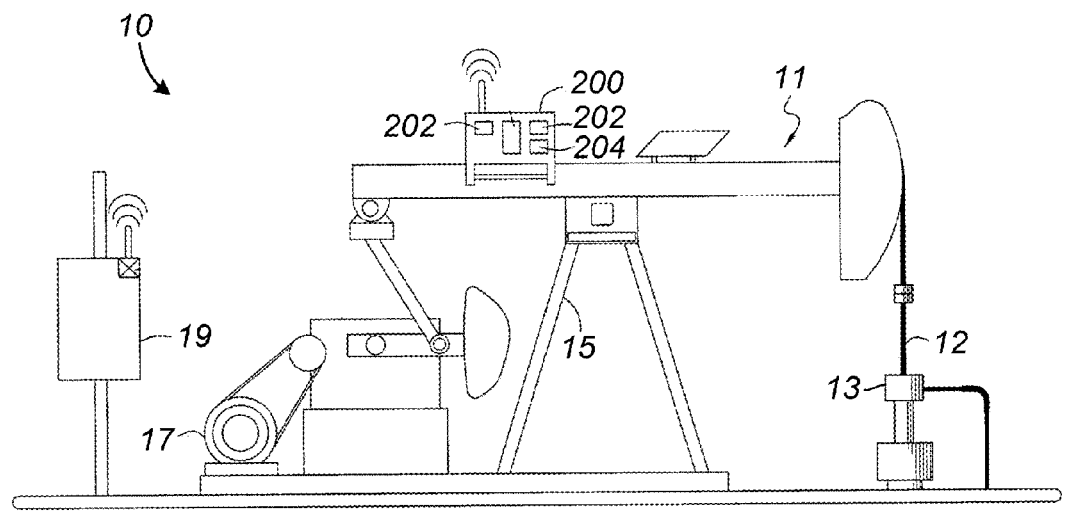
FIG. 6A illustrates a pump controller according the present disclosure for a sucker-rod pump system.

To that end, the teachings of the present disclosure can be implemented in a remote processing device or a pump controller. For example, FIG. 6A shows an embodiment of a pump controller 200 installed on a sucker-rod pump system 10, such as a pump jack commonly used to produce fluid from a well. The pump system 10 includes a walking beam 11 connected to a frame 15. The walking beam 11 operatively connects to a polished rod 12 connected via a rod string (not shown) to a downhole pump (not shown), which can be any downhole reciprocating pump as discussed herein. A control panel 19 controls an actuator (e.g., motor) 17 to move the walking beam 11 and reciprocate the polished rod 12, which in turn operates the downhole pump. Although a pump jack is shown, other sucker-rod pump systems can be used, such as a strap jack, or any other system that reciprocates a rod string using cables, belts, chains, and hydraulic and pneumatic power systems.

In general, sensors 202 and 204 measure load and position data of the pump system 10 at the surface, and the measured data from the sensors 202 and 204 is relayed to the controller 200. After processing the information, the controller 200 sends signals to the control panel 19 to operate the pump system 10. A particular arrangement of controller 200 and sensors 202 and 204 is disclosed in U.S. Pat. No. 7,032,659, which is incorporated herein by reference.

As shown, the controller 200 uses a load sensor 202 to detect the weight of the fluid in the production tubing during operation of the pump system 10 and uses a position sensor 204 to measure the position of the pump system 10 over each cycle of stroke. The position sensor 204 can be any position measurement device used for measuring position relative to the top or bottom of the stroke. For example, the position sensor 204 can be a dual position sensor that produces a continuous position measurement and a discrete switch output that closes and opens at preset positions of the polished rod 12.

Alternatively, the degree of rotation of the pump system's crank arm can provide displacement data. For example, a sensor can determine when the system's crank arm passes a specific location, and a pattern of simulated polished rod displacement versus time can be adjusted to provide an estimate of polished rod positions at times between these crank arm indications. In another alternative, a degree of inclination of the walking beam 11 can provide displacement data. For example, a device can be attached to the walking beam 11 to measure the degree of inclination of the pumping unit.

Load data of the system 10 can be directly measured using a load cell inserted between a polished rod clamp and carrier bar. Alternatively, the strain on the walking beam 11 can provide the load data. Using a load sensor 202, for example, the controller 200 can measure the strain on the polished rod 12 and can then control the pump system 10 based on the strain measured. The load sensor 202 may use any of a variety of strain-measuring devices known to a person of ordinary skill in the art. For example, the load sensor 202 can be a load measurement device used on the pump system 10 that includes a load cell installed on the pumping rod 12 or mounted on the walking beam 11. The load sensor 202 can measure strain in the polished rod 12 and can use a strain-gage transducer welded to the top flange of the walking beam 11.

Alternatively, the load sensor 202 can be a strain measuring device that clamps on to a load-bearing surface of the walking beam 11 or any convenient location as disclosed in U.S. Pat. No. 5,423,224. In another example, the load sensor 202 can use an assembly similar to what is disclosed in U.S. Pat. No. 7,032,659, which is incorporated herein by reference in its entirety.

Finally, the amplitude and frequency of the electrical power signal applied to the motor 17 can be used to determine motor rotation (i.e. displacement data) and motor torque (i.e. load data). In this way, the motor speed and the displacement of the polished rod can provide a series of motor speed and displacement data pairs at a plurality of displacements along the polished rod. That displacement data which represents a complete stroke of the pump system 10 can then be converted to load on the rod string and displacement of the rod string at a plurality of displacements along the polished rod, as described in U.S. Pat. No. 4,490,094.

C. Pump Controller

Figure 6B:
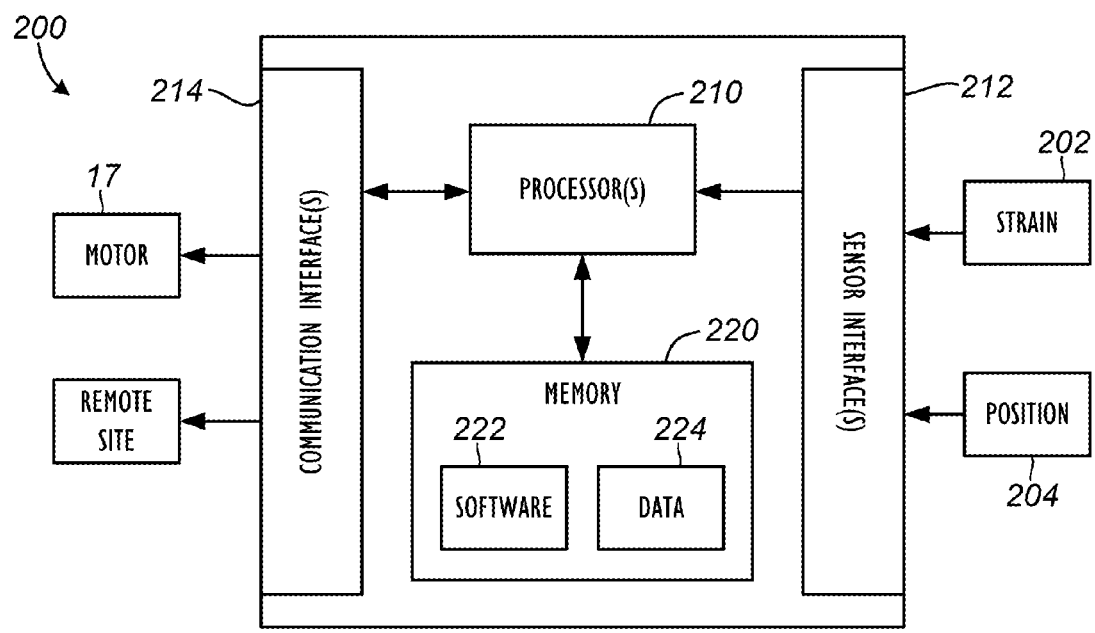
FIG. 6B illustrates a schematic of the pump controller for controlling/diagnosing the sucker-rod pump system according to the present disclosure.
Figure 7A:
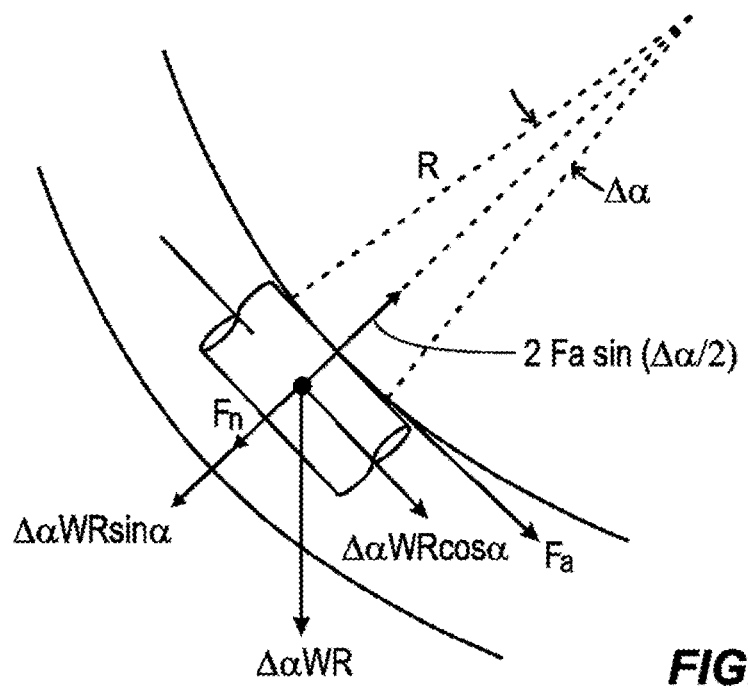
FIGS. 7A-7D illustrate forces involved for a unit section of rod string relative to buildup, slant, lower, and drop-off sections or segments according to the present disclosure.
Figure 7B:
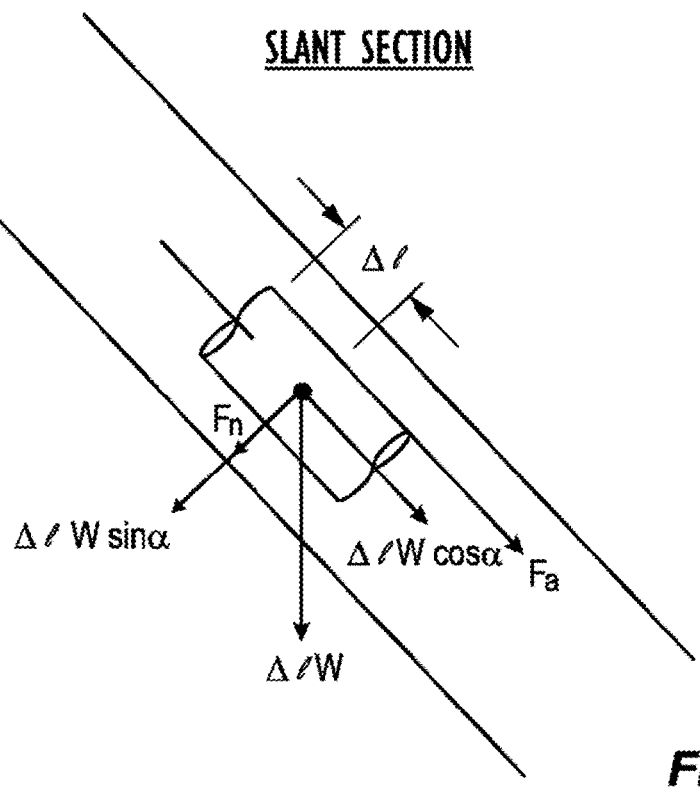
Figure 7C:
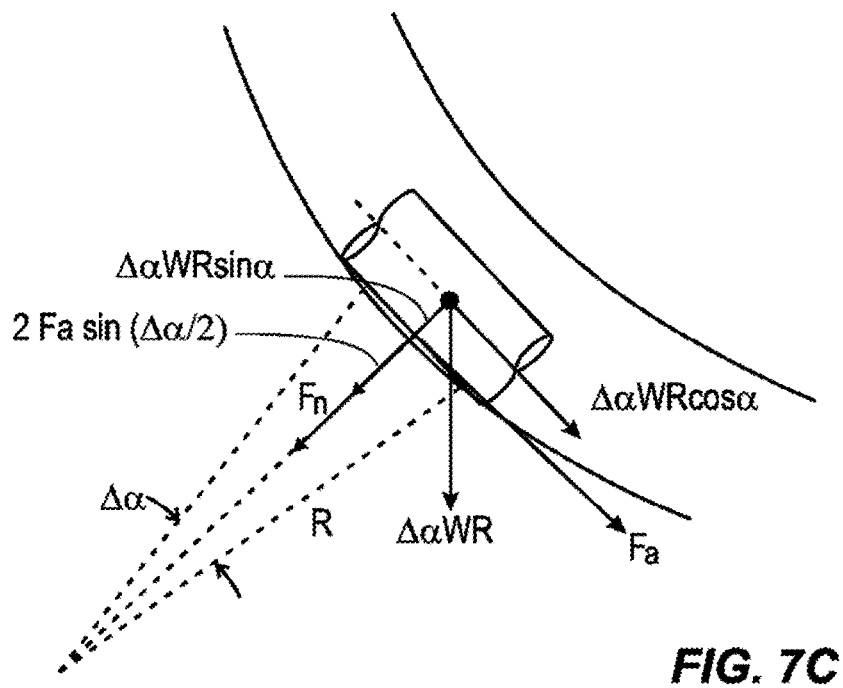
Figure 7D:
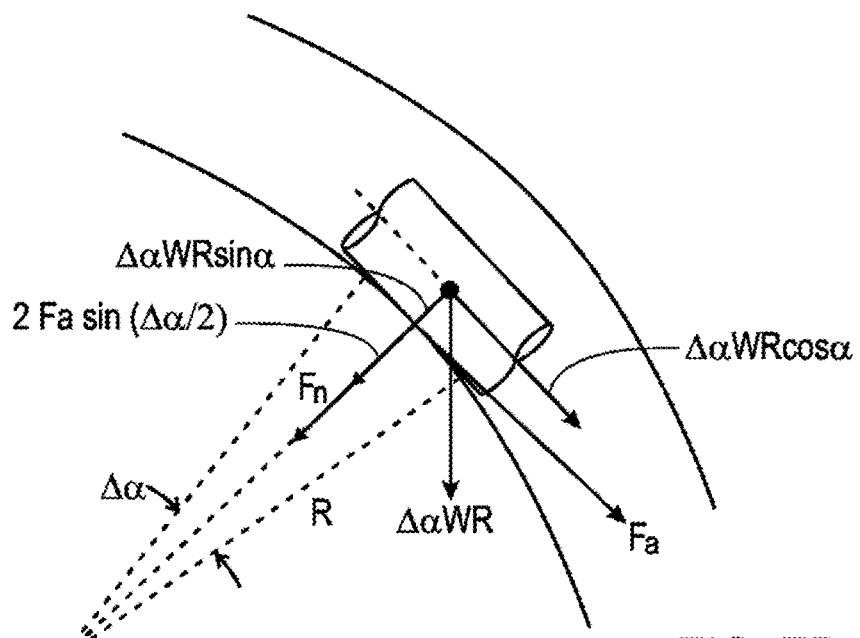

Details of the pump controller 200 are schematically shown in FIG. 6B. In general, the controller 200 includes one or more sensor interfaces 212 receiving measurements from the load and position sensors 202 and 204. Additional inputs of the controller 200 can connect to other devices, such as an infrared water-cut meter, an acoustic sounding device (ASD) provide real-time data which can be logged for pressure buildup analysis and real-time calibration for fluid-level control. The controller 200 also include a power system (not shown), as conventionally provided.

The controller 200 can have software 222 and data 224 stored in memory 220. The memory 220 can be a battery-backed volatile memory or a non-volatile memory, such as a one-time programmable memory or a flash memory. Further, the memory 220 may be any combination of suitable external and internal memories.

The software 222 can include motor control software and pump diagnostic software, and the data 224 stored can be the measurements logged from the various load and position sensors 202 and 204 and calculation results. The data 224 in the memory 220 stores characteristics of the well, including the depth, azimuth, and inclination of points along the well, which can be derived from drilling and survey data. Because the rod string may be tapered as is sometimes the case, the data 224 in the memory 220 can also store characteristics of the sucker rods taper, such as depth, diameter, weight, and length of various sections of the rod.

A processing unit 210 having one or more processors then processes the measurements by storing the measurement as data 224 in the memory 220 and by running the software 222 to make various calculations as detailed herein. For example, the processing unit 210 obtains outputs from the surface sensors, such as the load and position measurements from then sensors 202 and 204. In turn, the processing unit 210 correlates the output from the load sensor 202 to the position of the polished rod 12 and determines the load experienced by the polished rod 12 during the stroke cycles. Using the software 212, the processing unit 210 then calculates the downhole card, data, or information indicative of the load and position of the downhole pump.

To control the pump system 10, the pump controller 200 preferably uses a modified Everitt-Jennings algorithm with finite differences to solve the wave equation. The controller 200 calculates pump fillage and optimizes production on each stroke. This information is used to minimize fluid pounding by stopping or slowing down the pump system 10 at the assigned pump fillage setting. The pump controller 200 can also analyze the downhole pump card, data or information and determine potential problems associated with the pump and its operation. This is so because the shape, pattern, and other features associated with the downhole pump card represents various conditions of the pump and its operation.

After processing the measurements, the controller 200 sends signals to the control panel 19 to operate the pump system 10. For example, one or more communication interfaces 214 communicate with the control panel 19 to control operation of the pump system 10, such as shutting off the actuator (motor) 17 to prevent pump-off, etc. The communication interfaces 214 can be capable of suitable forms of communications, and they may also communicate data and calculation results to a remote site using any appropriate communication method.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A method of diagnosing a pump apparatus having a downhole pump disposed in tubing of a deviated wellbore, the downhole pump reciprocated in the tubing by a rod string operatively moved by an actuator at surface of the deviated wellbore, the method comprising:
   obtaining surface data indicative of surface load and surface position of the rod string at the surface;
   calculating downhole data from the surface data by solving a wave equation having viscous damping and Coulomb friction factors;
   accounting for a mechanical friction factor between the rod string and the tubing in the calculation of the downhole data by:
      parameterizing segments of the deviated wellbore;
      mapping the rod string to the parameterized segments;
      computing forces experienced by the mapped rod string during operation relative to the parameterized segments using force equations characterized for pulling out and running in the mapped rod string in the parameterized segments, and
      using the computed forces in the solution of the wave equation to calculate the downhole data;
   generating information from the downhole data representative of downhole load relative to downhole position of the downhole pump; and
   modifying operation of the actuator based on the generated information.

2. The method of claim 1, wherein the parameterized segments of the deviated wellbore comprise one or more of: a build-up segment, a slant segment, and a drop-off segment.

3. The method of claim 2, wherein the force equations characterized for pulling out and running in the mapped rod string in the parameterized segments comprise one or more of: first of the force equations characterized for pulling out and running in the mapped rod string in the build-up segment, second of the force equations characterized for pulling out and running in the mapped rod string in the slant segment, and third of the force equations characterized for pulling out and running in the mapped rod string in the drop-off segment.

4. The method of claim 2, wherein the build-up segment is characterized as having an inclination that increases with increasing depth, wherein the slant segment is characterized as having an inclination that remains constant with increasing depth, and wherein the drop-off segment is characterized as having an inclination that decreases with increasing depth.

5. The method of claim 1, wherein obtaining the surface data indicative of the surface load and the surface position of the rod string at the surface comprises at least one of:
   measuring the surface load and the surface position of the rod string at the surface; and
   obtaining the surface data from memory.

6. The method of claim 1, wherein parameterizing the segments of the deviated wellbore comprises:
   modelling a trajectory of the deviated wellbore; and
   parameterizing the segments in the modelled trajectory.

7. The method of claim 6, wherein modelling the trajectory and parameterizing the segments in the modeled trajectory comprise:
   obtaining a survey of the deviated wellbore at a plurality of measured increments;
   converting the survey into a parameterized equation in three-dimensions representative of the trajectory of the deviated wellbore; and
   identifying the segments of the trajectory from the parameterized equation.

8. The method of claim 6, wherein mapping the rod string to the parameterized segments comprises:
   determining a taper of the rod string for the modelled trajectory;
   dividing the taper of the rod string into a plurality of nodes; and
   modelling curvature of the tapered rod string along the modelled trajectory by interpolating values for depth, inclination, and azimuth for each node to coordinates of the modelled trajectory.

9. The method of claim 1, wherein computing the forces experienced by the mapped rod string during operation relative to the parameterized segments of the deviated wellbore comprises incrementally evaluating positions of a plurality of nodes of the rod string over time relative to the parameterized segments associated with the nodes.

10. The method of claim 9, wherein incrementally evaluating the positions of the nodes of the rod string over time relative to the parameterized segments associated with the nodes comprises:
   determining changes in the positions of the nodes of the rod string with respect to the parameterized segments associated with the nodes by evaluating, for each time increment over a span of time and for each particular node, a new position of the node with respect to the particular segment to which that particular node is associated.

11. The method of claim 9, wherein incrementally evaluating the positions of the nodes of the rod string over time relative to the parameterized segments associated with the nodes to compute the forces experienced by the rod string during operation comprises computing, from the surface data with the force equations, drag force and side load of each of the nodes of the rod string in time increments relative to the parameterized segments associated with the nodes.

12. The method of claim 11, wherein computing, from the surface data with the force equations, the drag force and the side load of each of the nodes of the rod string in time increments relative to the parameterized segments associated with the nodes comprises:
finding contact points between the nodes of the rod string and the parameterized segments by determining spatial positions of each of the nodes relative to the parameterized segments of the wellbore, and
calculating viscous damping and Coulomb friction values experienced by the rod string during operation for use as boundary conditions when solving the wave equation.

13. The method of claim 12, wherein calculating the Coulomb friction factor per taper comprises summing all of the drag forces for each time increment.

14. The method of claim 1, wherein using the computed forces in the solution of the wave equation to calculate the downhole data comprises using viscous damping and Coulomb friction values from the computed forces as boundary conditions in solving the wave equation.

15. The method of claim 1, wherein generating the information representative of the downhole load relative to the downhole position of the downhole pump comprises assessing, from the generated information, one or more of downhole pump operating condition, pump fillage, pump efficiency, pumped-off condition, gas displacement, fluid slippage, and rod conditions.

16. The method of claim 1, wherein calculating the downhole data from the surface data by solving the wave equation having the viscous damping and Coulomb friction factors comprises:
determining that iterations on the viscous damping and Coulomb friction factors have converged; or
changing boundary conditions used in the solution of the wave equation due to poor convergence and obtaining a new solution using the changed boundary conditions input into the wave equation.

17. The method of claim 1, wherein modifying the operation of the actuator based on the generated information comprises modifying at least one parameter operating the actuator of the pump apparatus based on the generated information.

18. The method of claim 1, wherein modifying the operation of the actuator based on the generated information comprises stopping the actuator or adjusting a speed of the actuator.

19. A program storage device having program instructions stored thereon for causing a programmable control device to perform a method of diagnosing a pump apparatus having a downhole pump disposed in tubing of a deviated wellbore, the downhole pump reciprocated in the tubing by a rod string operatively moved by an actuator at surface of the deviated wellbore, the method comprising:
obtaining surface data indicative of surface load and surface position of the rod string at the surface;
calculating downhole data from the surface data by solving a wave equation having viscous damping and Coulomb friction factors;
accounting for a mechanical friction factor between the rod string and the tubing in the calculation of the downhole data by:
parameterizing segments of the deviated wellbore;
mapping the rod string to the parameterized segments;
computing forces experienced by the mapped rod string during operation relative to the parameterized segments using force equations characterized for pulling out and running in the mapped rod string in the parameterized segments, and
using the computed forces in the solution of the wave equation to calculate the downhole data;
generating information from the downhole data representative of downhole load relative to downhole position of the downhole pump; and
modifying operation of the actuator based on the generated information.

20. A method of diagnosing a pump apparatus having a downhole pump disposed in a deviated wellbore, the downhole pump reciprocated in the deviated wellbore by a rod string operatively moved by an actuator at surface of the deviated wellbore, the method comprising:
obtaining a trajectory of the deviated wellbore;
parameterizing a plurality of segments in the trajectory;
mapping nodes of the rod string in time increments to the parameterized segments of the trajectory;
obtaining surface measurements indicative of surface load and surface position of the rod string at the surface;
computing, from the surface measurements, forces of each of the nodes of the rod string in the time increments mapped to the parameterized segments of the trajectory using force equations characterized for pulling out and running in the nodes in the parameterized segments;
computing downhole data of load and position by solving a wave equation using the surface measurements and using information from the computed forces and side loads as boundary conditions;
generating information representative of downhole load relative to downhole position of the downhole pump based on the solution of the wave equation; and
modifying operation of the actuator based on the generated information.

21. The method of claim 20, wherein modifying the operation of the actuator based on the generated information comprises adjusting at least one parameter operating of the actuator of the pump apparatus based on the generated information.

22. The method of claim 20, wherein modifying the operation of the actuator based on the generated information comprises stopping the actuator or adjusting a speed of the actuator.

23. A controller for a pump apparatus having a surface actuator and having a downhole pump, the downhole pump disposed in a deviated wellbore and reciprocated by a rod string disposed in the deviated wellbore, the controller comprising:
one or more interfaces obtaining surface measurements indicative of surface load and surface position of the rod string at the surface;

memory in communication with the one or more interfaces, the memory storing a trajectory of the wellbore having a plurality of parametrized segments and storing a mapping of the rod string to the parameterized segments; and a processing unit in communication with the one or more interfaces and the memory and configured to:

calculate downhole data from the surface data by solving a wave equation having viscous damping and Coulomb friction factors;

compute, with force equations characterized for pulling out and running in the mapped rod string in the parameterized segments, forces experienced by the mapped rod string during operation, use the computed forces and side loads in the solution of the wave equation to calculate the downhole data to account for a mechanical friction factor between the rod string and the tubing in the calculation of the downhole data;

generate information from the downhole data representative of downhole load relative to downhole position of the downhole pump; and modify operation of the actuator based on the generated information.

24. The controller of claim 23, wherein to modify the operation of the actuator based on the generated information, the processing unit is configured to adjust at least one parameter operating the actuator of the pump apparatus based on the generated information.

25. The controller of claim 23, wherein to modify the operation of the actuator based on the generated information, the processing unit is configured to stop the actuator or adjust a speed of the actuator.

* * * * *